(12) United States Patent
Wang

(10) Patent No.: US 12,156,461 B2
(45) Date of Patent: Nov. 26, 2024

(54) OLED DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wenqiang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 837 days.

(21) Appl. No.: 17/261,912

(22) PCT Filed: Nov. 18, 2020

(86) PCT No.: PCT/CN2020/129725
§ 371 (c)(1),
(2) Date: Jan. 21, 2021

(87) PCT Pub. No.: WO2022/062140
PCT Pub. Date: Mar. 31, 2022

(65) Prior Publication Data
US 2022/0359838 A1 Nov. 10, 2022

(30) Foreign Application Priority Data
Sep. 24, 2020 (CN) .......................... 202011013598.X

(51) Int. Cl.
*H10K 77/10* (2023.01)
*G09F 9/30* (2006.01)
(Continued)

(52) U.S. Cl.
CPC ............ *H10K 77/111* (2023.02); *G09F 9/301* (2013.01); *G09F 9/335* (2021.05); *H10K 2102/311* (2023.02)

(58) Field of Classification Search
None
See application file for complete search history.

(56) References Cited

U.S. PATENT DOCUMENTS 7,558,057 B1 * 7/2009 Naksen ................. G06F 1/1613
361/679.56
9,179,559 B1 11/2015 Kim
(Continued)

FOREIGN PATENT DOCUMENTS

| CN | 105788458 A | 7/2016 |
|---|---|---|
| CN | 105810104 A | 7/2016 |

(Continued)

*Primary Examiner* — Ali Naraghi
*Assistant Examiner* — E. Rhett Cheek
(74) *Attorney, Agent, or Firm* — PV IP PC; Wei Te Chung

(57) ABSTRACT

An organic light-emitting diode (OLED) display device is provided, which includes an OLED display module, the OLED display module includes a plurality of sub-display sections, adjacent sub-display sections are dynamically connected to each other, and the sub-display sections can be expanded and integrated into a large-area display region, or dynamically accommodated to form at least one display section. By dynamically connecting multiple sub-display sections, a large-sized flexible display screen can be folded.

17 Claims, 6 Drawing Sheets

(51) Int. Cl.
*G09F 9/33* (2006.01)
*H10K 102/00* (2023.01)

(56) References Cited

U.S. PATENT DOCUMENTS

| | | | |
|---|---|---|---|
| 9,985,236 | B2 | 5/2018 | Kim et al. |
| 11,140,252 | B1* | 10/2021 | Choi .................... G06F 1/1624 |
| 2016/0212840 | A1 | 7/2016 | Koo et al. |
| 2018/0095502 | A1* | 4/2018 | Yamazaki ............ H10K 59/121 |
| 2019/0250669 | A1* | 8/2019 | Liao ..................... G04G 17/045 |
| 2019/0269023 | A1 | 8/2019 | Li |
| 2020/0225711 | A1* | 7/2020 | Pelissier ............... G06F 1/1624 |
| 2021/0382526 | A1* | 12/2021 | Lai .......................... G09F 9/301 |
| 2021/0405857 | A1* | 12/2021 | Kim ...................... G06F 1/1681 |
| 2021/0407345 | A1* | 12/2021 | Wang .................... G06F 1/1681 |
| 2022/0254281 | A1* | 8/2022 | Zhang ................... G06F 1/1601 |
| 2022/0322551 | A1* | 10/2022 | Cheng ................. H04M 1/0235 |
| 2022/0326737 | A1* | 10/2022 | Ran ....................... G06F 1/1652 |
| 2023/0208959 | A1* | 6/2023 | Yen ...................... H05K 5/0217 |
| | | | 455/566 |

FOREIGN PATENT DOCUMENTS

| | | | | |
|---|---|---|---|---|
| CN | 108364572 | A | | 8/2018 |
| CN | 208044999 | U | * | 11/2018 |
| CN | 109243308 | A | * | 1/2019 ............. G09F 9/301 |
| CN | 109555422 | A | * | 4/2019 ....... B32B 17/10036 |
| CN | 111261049 | A | * | 6/2020 |

* cited by examiner

OLED DISPLAY DEVICE

FIELD OF INVENTION

The present invention relates to the field of organic light-emitting diode (OLED) display technologies, and in particular to an OLED display device.

BACKGROUND OF INVENTION

Present large-sized flexible display screens are usually folded in three single ways, namely, folding, curling, and stretching. However, an overall expandable size of the large-sized flexible display screens is affected by a screen curling radius and number of times curled. Therefore, it is impossible to achieve a folding requirement of larger display sizes.

Technical Problem

Therefore, conventional organic light-emitting diode (OLED) display devices have a technical problem that a single folding method cannot satisfy large-size folding.

SUMMARY OF INVENTION

Technical Solutions

An embodiment of the present invention provides an organic light-emitting diode (OLED) display device, which can alleviate a technical problem that a single folding method of conventional OLED display devices cannot meet large-size folding.

An embodiment of the present invention provides an OLED display device including an OLED display module, wherein the OLED display module includes at least a first sub-display section, a second sub-display section, and a third sub-display section, adjacent sub-display sections are dynamically connected to each other, the first sub-display section, the second sub-display section, and the third sub-display section can be expanded and integrated into a large-area display region, or dynamically accommodated to form at least one display section.

In an embodiment of the OLED display device according to the present invention, wherein a bending section is disposed between the first sub-display section and the second sub-display section, when the OLED display module is completely expanded, the first sub-display section, the second sub-display section, and the third sub-display section are disposed in a same plane, and when the OLED display module is completely folded, the bending section is in a bent state, the first sub-display section is bent to a back of the second sub-display section, and the third sub-display section is accommodated into the second sub-display section.

In an embodiment of the OLED display device according to the present invention, the OLED display device further including a curling mechanism and a folding mechanism, wherein the curling mechanism includes a curling mechanism module and a sliding rail, and the sliding rail is positioned on a back of the third sub-display section.

In an embodiment of the OLED display device according to the present invention, the first sub-display section and the second sub-display section are folded by the folding mechanism, the second sub-display section and the third sub-display section are slid relatively through the sliding rail, and the curling mechanism is configured to expand and contract a display screen during a sliding or folding process.

In an embodiment of the OLED display device according to the present invention, the first sub-display section is an outwardly folding section, the second sub-display section is a main display section, and the third sub-display section is a curling section.

In an embodiment of the OLED display device according to the present invention, the curling mechanism module includes a containing cavity, and the containing cavity is configured to receive the curling section in a curled state.

In an embodiment of the OLED display device according to the present invention, when the OLED display module is completely folded, the outwardly folding section is positioned on a back of the main display section, the curling section is positioned in the containing cavity, and the bending section is in a maximum bending state.

In an embodiment of the OLED display device according to the present invention, a plurality of pulleys are disposed on a back of the curling section, the pulleys are correspondingly disposed above the sliding rail, and the pulleys are configured to drive the OLED display module to move along the sliding rail.

In an embodiment of the OLED display device according to the present invention, the folding mechanism includes a first part, a folding part, and a second part, the first part is disposed on a back of the outwardly folding section, the second part is disposed on a back of the main display section, and wherein the folding part is in contact with the first part and the second part, respectively, and the first part is configured to bend along the folding part toward a back of the second part.

In an embodiment of the OLED display device according to the present invention, when the OLED display module is completely expanded, the outwardly folding section, the bending section, the main display section, and the curling section are disposed in a same plane, the first part is disposed on the back of the outwardly folding section, the second part is disposed on the back of the main display section, and the folding part is disposed in a back of the bending section.

In an embodiment of the OLED display device according to the present invention, when the OLED display module is folded, the curling section is completely curled into the containing cavity, the first part of the folding mechanism is unfolded, and the first part and the second part are in a same plane.

In an embodiment of the OLED display device according to the present invention, when the OLED display module is folded, the curling section is not curled into the containing cavity, the first part of the folding mechanism is completely folded, and the first part is disposed on the back of the second part.

In an embodiment of the OLED display device according to the present invention, the folding part is a folding hinge.

In an embodiment of the OLED display device according to the present invention, the first part is a housing of the outwardly folding section, and the second part is a housing of the main display section.

In an embodiment of the OLED display device according to the present invention, a plurality of fence pulleys are disposed on the back of the main display section, a plurality of first fence slide rails are disposed on the second part positioned above the fence pulleys, and when the curling section moves toward the containing cavity, the fence pulleys drive the main display section to move along the first fence slide rails.

In an embodiment of the OLED display device according to the present invention, the second part is defined with a sliding groove, the sliding groove is defined at an edge of the second part, the sliding groove is in contact with the sliding rail, the sliding groove can be moved along the sliding rail, and when the OLED display module is completely folded, the sliding rail is disposed in the sliding groove.

In an embodiment of the OLED display device according to the present invention, a longitudinal cross-sectional shape of the sliding groove is rectangular.

In an embodiment of the OLED display device according to the present invention, the dynamically connected to each other includes one or more of bending, curling, or stretching.

In an embodiment of the OLED display device according to the present invention, the adjacent sub-display sections are dynamically connected to each other by bending, a bending section is disposed between the first sub-display section and the second sub-display section, and a bending section is also disposed between the second sub-display section and the third sub-display section.

In an embodiment of the OLED display device according to the present invention, when the OLED display module is completely folded, the first sub-display section and the third sub-display section are disposed on a back of the second sub-display section.

Beneficial Effect

Advantageous effects are as follows. The OLED display device according to the embodiment of the present invention includes an OLED display module, wherein the OLED display module includes at least a first sub-display section, a second sub-display section, and a third sub-display section, adjacent sub-display sections are dynamically connected to each other, the first sub-display section, the second sub-display section, and the third sub-display section can be expanded and integrated into a large-area display region, or dynamically accommodated to form at least one display section. By dynamically connecting multiple sub-display sections, a large-sized flexible display screen can be folded, which can alleviate the technical problem that a single folding method of conventional OLED display devices cannot satisfy large-size folding.

BRIEF DESCRIPTION OF FIGURES

The following detailed description of the specific embodiments of the present invention in conjunction with the accompanying drawings will make the technical solutions and other beneficial effects of the present invention obvious.

DETAILED DESCRIPTION OF EMBODIMENTS

Figure 1:
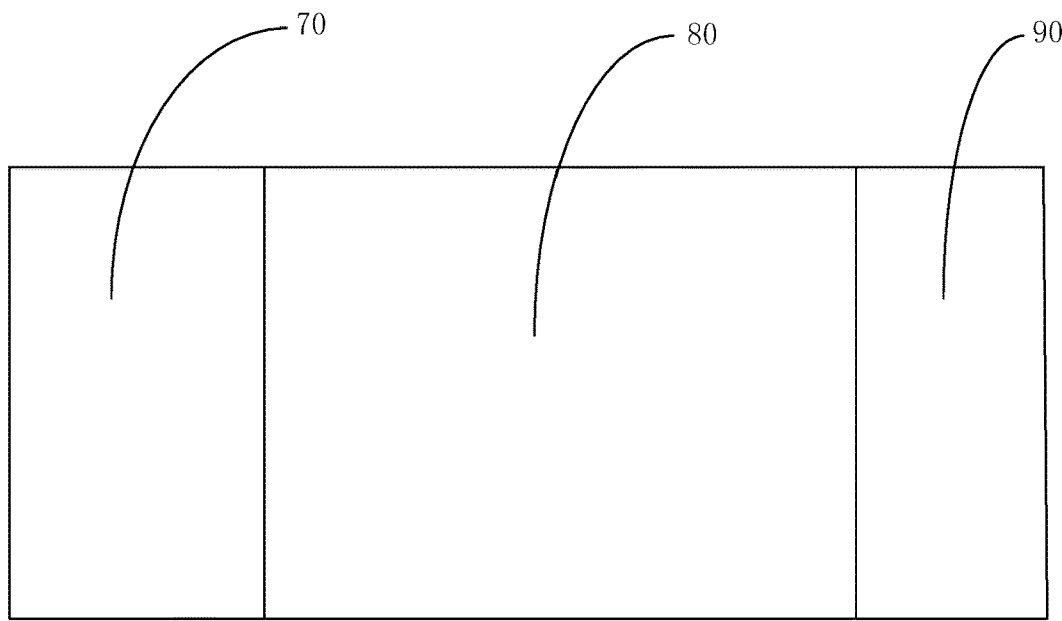
FIG. 1 is a first schematic top view of an organic light-emitting diode (OLED) display module of an OLED display device according to an embodiment of the present invention.

In order to illustrate the technical solutions of the present application or the related art in a clearer manner, the drawings desired for the present application or the related art will be described hereinafter briefly. Obviously, the following drawings merely relate to some embodiments of the present application, and based on these drawings, a person skilled in the art may obtain the other drawings without any creative effort.

In the description of the present invention, it is to be understood that the terms such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise", etc., the orientation or positional relationship of the indications is based on the orientation or positional relationship shown in the drawings, and is merely for the convenience of the description of the invention and the simplified description, rather than indicating or implying that the device or part referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different parts rather than to represent any order, number or importance. Therefore, the features defined with "first" and "second" may explicitly or implicitly include one or more of the features. In the description of the present invention, the meaning of "plurality" is two or more unless specifically defined otherwise.

Figure 2:
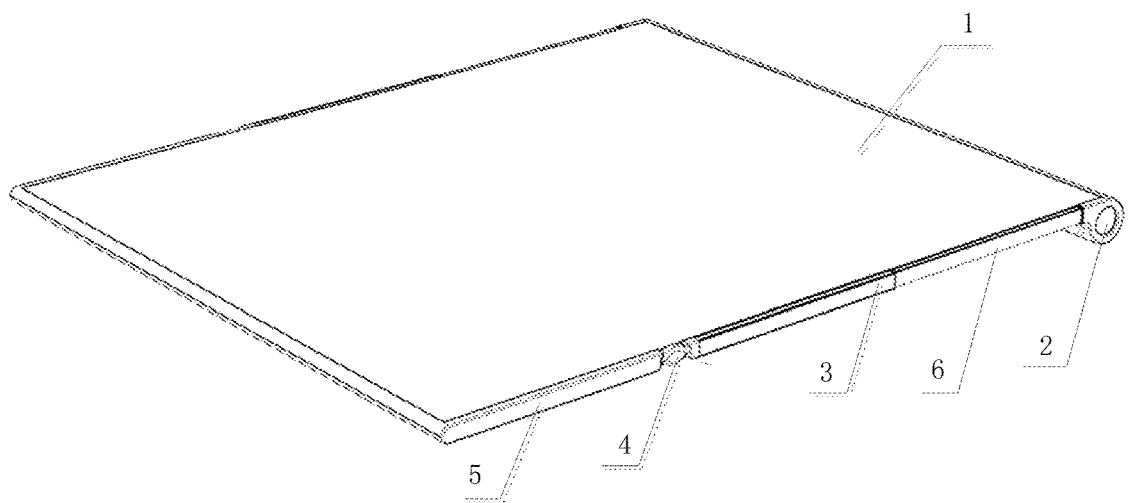
FIG. 2 is a schematic diagram of a first structure of the OLED display device according to an embodiment of the present invention.
Figure 3:
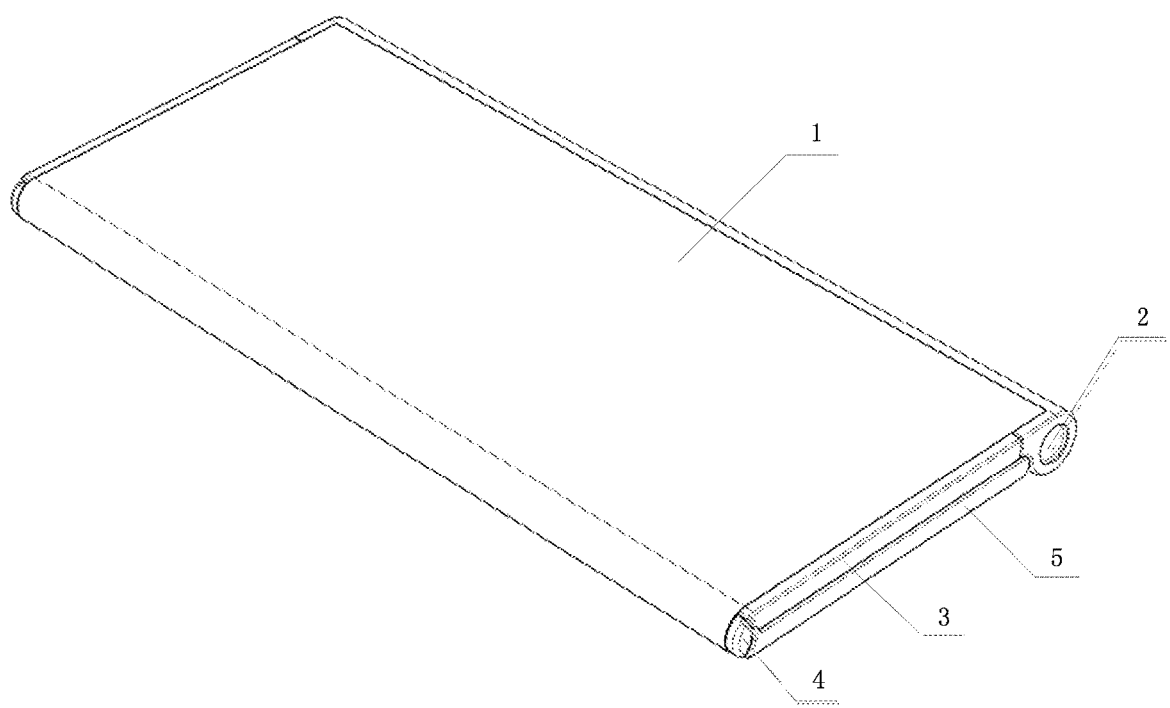
FIG. 3 is a schematic diagram of a second structure of the OLED display device according to an embodiment of the present invention.

As shown in FIG. 1, FIG. 2, and FIG. 3, an organic light-emitting diode (OLED) display device according to an embodiment of the present invention includes an OLED display module, wherein the OLED display module at least includes a first sub-display section 70, a second sub-display section 80, and a third sub-display section 90, and adjacent sub-display sections are dynamically connected to each other. Moreover, the first sub-display section 70, the second sub-display section 80, and the third sub-display section 90 can be expanded and integrated into a large-area display region, or dynamically accommodated to form at least one display section.

In the present embodiment, the OLED display device further includes a curling mechanism and a folding mechanism. The OLED display module includes at least the first sub-display section 70, the second sub-display section 80, and the third sub-display section 90. The adjacent sub-display sections are dynamically connected to each other, and the first sub-display section 70, the second sub-display section 80, and the third sub-display section 90 can be expanded and integrated into the large-area display region, or dynamically accommodated to form at least one display section. By dynamically connecting multiple sub-display sections, a large-sized flexible display screen can be folded, which can alleviate the technical problem that a single folding method of conventional OLED display devices cannot satisfy large-size folding.

In an embodiment, a dynamic connection of the adjacent sub-display sections includes one or more of bending, curling, or stretching.

In an embodiment, the adjacent sub-display sections are dynamically connected to each other by bending, a bending section is disposed between the first sub-display section 70 and the second sub-display section 80, and a bending section is also disposed between the second sub-display section 80 and the third sub-display section 90.

In an embodiment, the bending section is disposed between the first sub-display section 70 and the second sub-display section 80. When the OLED display module is completely expanded, the first sub-display section 70, the second sub-display section 80, and the third sub-display section 90 are disposed in a same plane, and when the OLED display module is completely folded, the bending section is in a bent state, the first sub-display section 70 is bent to a back of the second sub-display section 80, and the third sub-display section 90 is accommodated into the second sub-display section 80.

In an embodiment, when the OLED display module is completely folded, the first sub-display section 70 and the third sub-display section 90 are disposed on the back of the second sub-display section 80.

In an embodiment, the adjacent sub-display sections are dynamically connected by curling.

In an embodiment, the OLED display device further includes the curling mechanism and the folding mechanism. The curling mechanism includes a curling mechanism module and a sliding rail 6, and the sliding rail 6 is positioned at a back of the curling mechanism.

In an embodiment, the first sub-display section 70 and the second sub-display section 80 are folded by the folding mechanism, the second sub-display section 80 and the third sub-display section 90 are slid relatively through the sliding rail 6, and the curling mechanism is configured to expand and contract a display screen during a sliding or folding process.

In an embodiment, the first sub-display section 70 is an outwardly folding section 7, the second sub-display section 80 is a main display section 9, and the third sub-display section 90 is a curling section 10.

Figure 4:
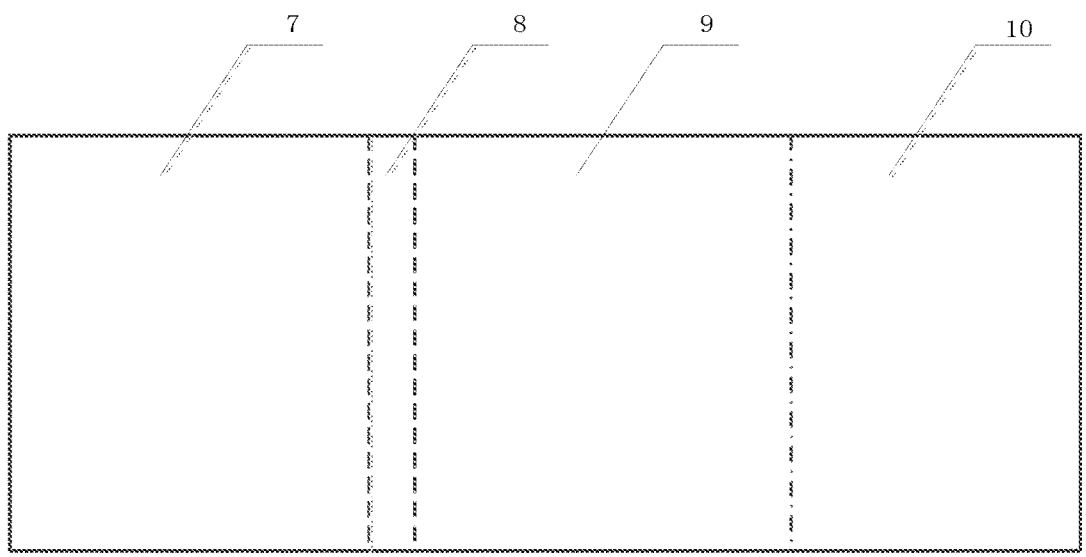
FIG. 4 is a second schematic top view of the OLED display module of the OLED display device according to an embodiment of the present invention.

In an embodiment, as shown in FIG. 2, FIG. 3, and FIG. 4, the OLED display device further includes the curling mechanism and the folding mechanism. The first sub-display section is the outwardly folding section 7, the second sub-display section is the main display section 9, and the third sub-display section is the curling section 10. Wherein, a bending section 8 is disposed between the outwardly folding section 7 and the main display section 9. When the OLED display module is completely expanded, the first sub-display section, the second sub-display section, and the third sub-display section are disposed in the same plane, and when the OLED display module is completely folded, the bending section is in the bent state, the outwardly folding section 7 is accommodated at a back of the main display section 9, and the curling section 10 is accommodated in the curling mechanism and in a curled state.

In the present embodiment, the OLED display device further includes the curling mechanism and the folding mechanism. The first sub-display section is the outwardly folding section 7, the second sub-display section is the main display section 9, and the third sub-display section is the curling section 10. Wherein, the bending section 8 is disposed between the outwardly folding section 7 and the main display section 9. When the OLED display module is completely expanded, the first sub-display section, the second sub-display section, and the third sub-display section are disposed in the same plane. When the OLED display module is completely folded, the bending section is in the bent state, the outwardly folding section 7 is accommodated at the back of the main display section 9, and the curling section 10 is accommodated in the main display section and in the curled state. By dynamically connecting multiple sub-display sections, the large-sized flexible display screen can be folded, which can alleviate the technical problem that the single folding method of the conventional OLED display devices cannot satisfy large-size folding.

Wherein, the curling mechanism includes the curling mechanism module 2 and the sliding rail 6.

Wherein, the folding mechanism includes a first part, a folding part 4, and a second part.

Wherein, as shown in FIG. 2, when the OLED display module 1 is completely expanded, the outwardly folding section 7, the bending section 8, the main display section 9, and the curling section 10 are disposed in a same plane, the first part is disposed on a back of the outwardly folding section 7, the second part is disposed on the back of the main display section 9, and the folding part 4 is disposed on a back of the bending section 8.

Wherein, as shown in FIG. 2, the sliding rail 6 is disposed on a back of the curling section 10, and the curling mechanism module 2 is in contact with the sliding rail 6.

Wherein, the second part further includes a sliding groove 18, the sliding rail 6 is in contact with the sliding groove 18, when the curling section 10 moves to the curling mechanism module 2, the curling section 10 drives the sliding groove 18 to move, and the sliding groove 18 moves toward the curling mechanism module 2 along the sliding rail 6.

Wherein, as shown in FIG. 3, when the OLED display module 1 is completely folded, the sliding rail 6 is surrounded by the sliding groove 18, and the sliding groove 18 is in contact with the curling mechanism module 2.

In an embodiment, the curling mechanism includes the curling mechanism module 2 and the sliding rail 6, the sliding rail 6 is positioned on the back of the curling section 10, and the curling mechanism module 2 is in contact with the sliding rail 6.

Wherein, the curling mechanism module 2 can include a containing cavity, a power assembly, and a braking assembly, and the power assembly can include a reel.

Wherein, the braking assembly is configured to fix the curling section 10 to achieve different display effects and folding effects.

Wherein, the power assembly is in contact with the curling section 10, and the power assembly drives the curling section 10 to move into the containing cavity.

Wherein, when the OLED display module 1 is completely folded, the curling section 10 is positioned in the containing cavity, and the curling section 10 is in the curled state.

In an embodiment, the curling mechanism module 2 includes the containing cavity, and the containing cavity is configured to receive the curling section 10 in the curled state.

Figure 10:
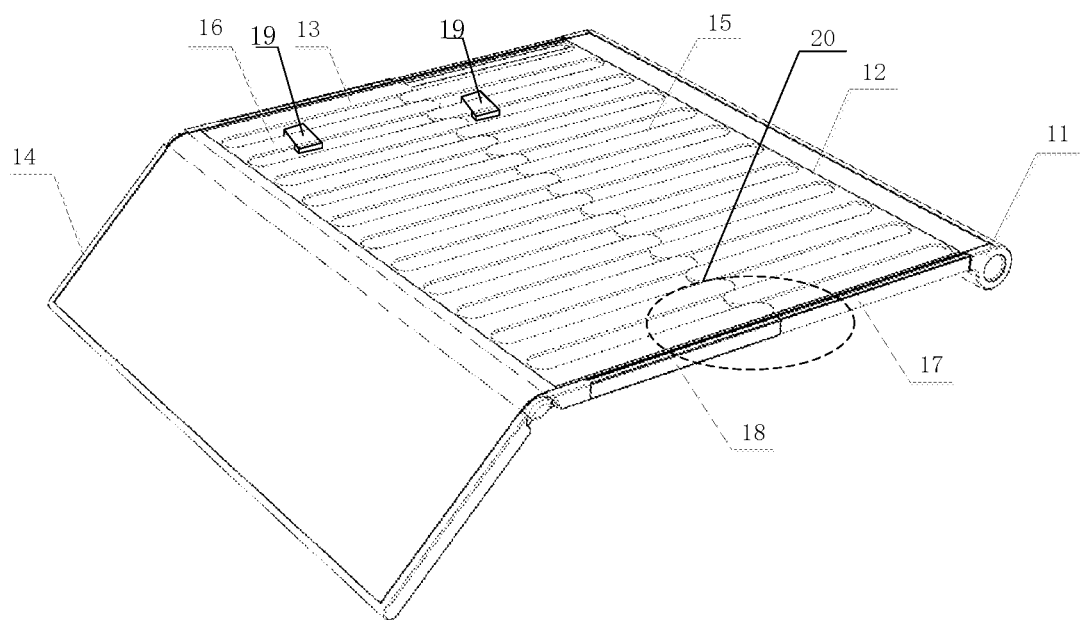
FIG. 10 is a schematic structural diagram of a housing of the OLED display device according to an embodiment of the present invention, with removing a second sub-display section and a third sub-display section of an OLED display module, and remaining pulleys.

In an embodiment, as shown in FIG. 10, one fence pulley 19 is shown in a part of the folding mechanism which is corresponding to the curling section 10, and other same fence pulleys in this part are not shown. A plurality of fence pulleys 19 are disposed on the back of the curling section 10, and the pulleys are disposed above the sliding rail 6, and the pulleys are configured to drive the OLED display module 1 to move along the sliding rail 6.

Wherein, a plurality of tracks are disposed on a surface of the sliding rail 6 facing the curling section 10, the tracks are correspondingly disposed below the pulleys, and the pulleys move toward the curling mechanism module 2 along the tracks.

Wherein, the pulleys and the tracks are configured to reduce a resistance that the curling section 10 receives when moving toward the curling mechanism module 2.

Wherein, when the curling section 10 curls and moves into the containing cavity, the pulleys positioned on the back of the curling section 10 move along the tracks.

In an embodiment, the tracks are disposed on the back of the curling section 10, and the sliding rail 6 is disposed with the pulleys positioned corresponding to the tracks.

Wherein, the tracks are correspondingly disposed above the pulleys, and the pulleys can move toward the curling mechanism module 2 along the tracks.

Wherein, the pulleys and the tracks are configured to reduce the resistance that the curling section 10 receives when moving toward the curling mechanism module 2.

Wherein, when the curling section 10 curls and moves into the containing cavity, the pulleys positioned on the back of the curling section 10 move along the tracks.

In an embodiment, the folding mechanism includes the first part, the folding part 4, and the second part. The first part is disposed on the back of the outwardly folding section 7, and the second part is disposed on the back of the main display section 9, wherein the folding part 4 is in contact with the first part and the second part, respectively, and the first part can be bent toward a back of the second part along folding part 4.

In an embodiment, the folding part is a folding hinge.

Wherein, the folding part 4 can also be a shaft, and the first part and the second part rotate around the shaft.

In an embodiment, the first part is a housing of the outwardly folding section 7 and the second part is a housing of the main display section 9.

Wherein, a surface area of the first part is less than a surface area of the second part.

Wherein, shapes of the first part and the second part are rectangular, parallelogram, or trapezoidal.

In an embodiment, as shown in FIG. 10, one fence pulley 19 is shown in a part of the folding mechanism which is corresponding to the main display section 9, and other same fence pulleys in this part are not shown. A plurality of fence pulleys are disposed on the back of the main display section 9, a plurality of first fence slide rails 16 are disposed on the second part positioned beneath the fence pulleys, and when the curling section 10 moves toward the containing cavity, the fence pulleys drive the main display section 9 to move along the first fence slide rails 16.

Wherein, a surface of the second part facing the main display section 9 is disposed with the first fence slide rails 16, the first fence slide rails 16 are correspondingly disposed below the fence pulleys, and the fence pulleys can move toward the curling mechanism module 2 along the first fence slide rails 16.

Wherein, the fence pulleys and the first fence slide rails 16 are configured to reduce the resistance that the main display section 9 receives when moving toward the curling mechanism module 2.

Wherein, when the main display section 9 moves to the curling mechanism module 2, the fence pulleys positioned on the back of the main display section 9 move along the first fence slide rails 16.

In an embodiment, the second part is disposed with the sliding groove 18, the sliding groove 18 is defined at an edge of the second part, and the sliding groove 18 is in contact with the sliding rail. The sliding groove 18 can be moved along the sliding rail. When the OLED display module 1 is completely folded, the sliding rail is disposed in the sliding groove 18.

Wherein, when the curling section 10 moves toward the curling mechanism module 2, the sliding groove 18 moves toward the curling mechanism module 2 along the sliding rail.

In an embodiment, a longitudinal cross-sectional shape of the sliding groove 18 is rectangular.

In an embodiment, the longitudinal cross-sectional shape of the sliding groove 18 is trapezoidal.

In an embodiment, the longitudinal cross-sectional shape of the sliding groove 18 is parallelogram.

Figure 5:
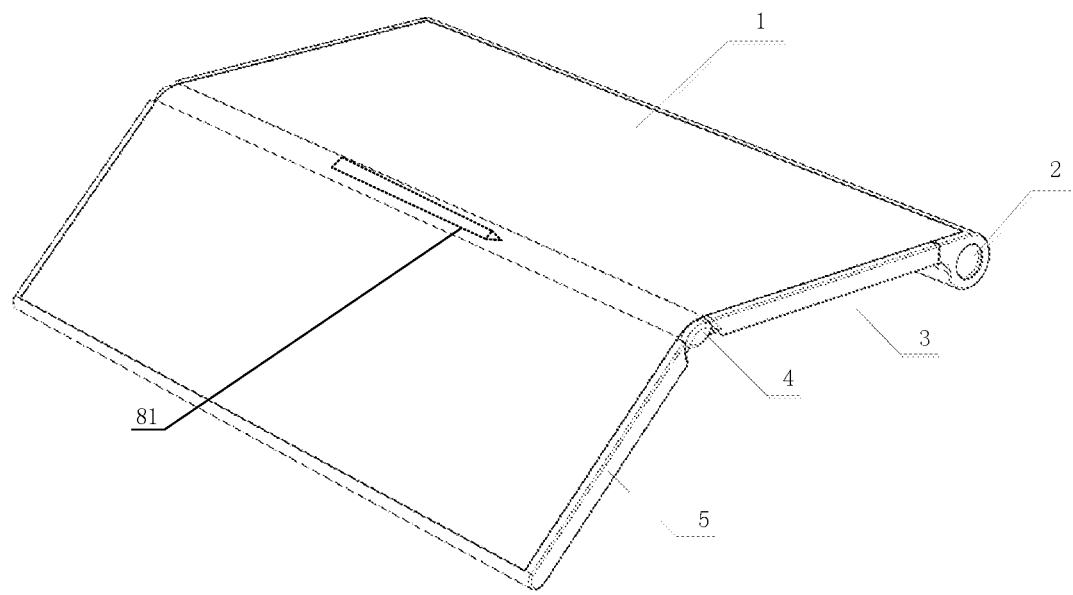
FIG. 5 is a schematic diagram of a third structure of the OLED display device according to an embodiment of the present invention.

In an embodiment, as shown in FIG. 5, the OLED display device is folded, wherein the curling section 10 is completely curled, and the first part 5 of the folding mechanism and the folding part 4 are formed with an obtuse angle.

Wherein, the sliding rail 6 is completely disposed in the sliding groove 18, and the curling section 10 is disposed in the containing cavity.

Wherein, the first part 5 is bent at a certain angle around the folding part 4.

Wherein, as shown in FIG. 5, the bending section 8 further includes a fixing block 81. After the first part 5 is bent at the certain angle, the fixing block is configured to fix the first part 5.

In an embodiment, the OLED display device is folded, wherein the curling section 10 is completely curled, and the first part 5 of the folding mechanism and the folding part 4 are formed with an acute angle.

Figure 6:
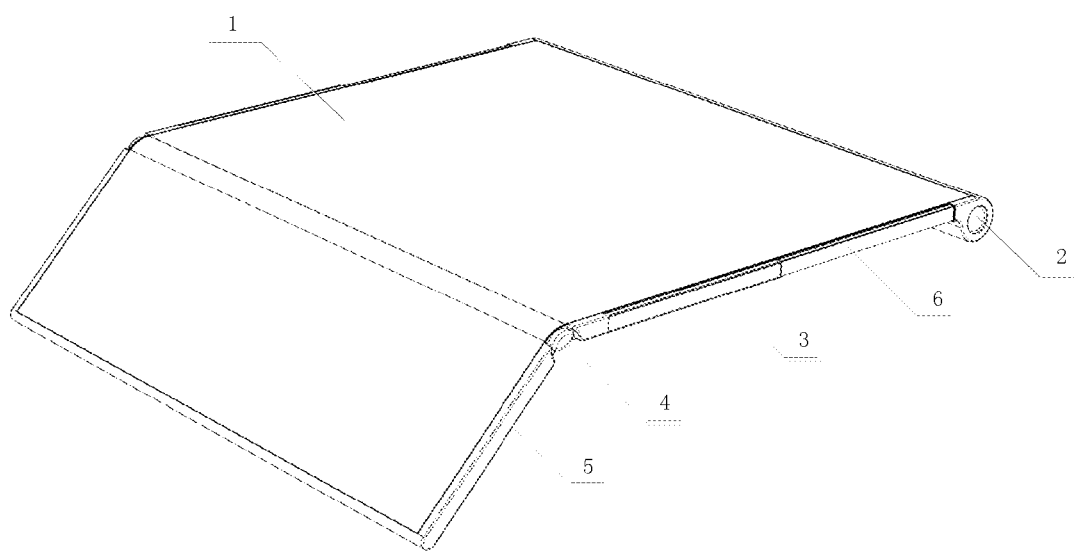
FIG. 6 is a schematic diagram of a fourth structure of the OLED display device according to an embodiment of the present invention.

In an embodiment, as shown in FIG. 6, the OLED display device is folded, wherein the curling section 10 is not curled, and the first part 5 of the folding mechanism is folded.

Wherein, the sliding rail 6 is in contact with the sliding groove 18.

Wherein, an included angle formed between the first part 5 and the second part 3 ranges from 0 degrees to 180 degrees.

Wherein, the shape of the first part 5 can be rectangular, and the shape of the second part 3 can also be rectangular.

Wherein, the surface area of the first part 5 can be less than the surface area of the second part 3.

Wherein, the surface area of the first part 5 can also be equal to the surface area of the second part 3.

Wherein, when the first part 5 is folded, in the OLED display module, the main display section 9 is not displayed, and the outwardly folding section 7 displays an image.

Figure 7:
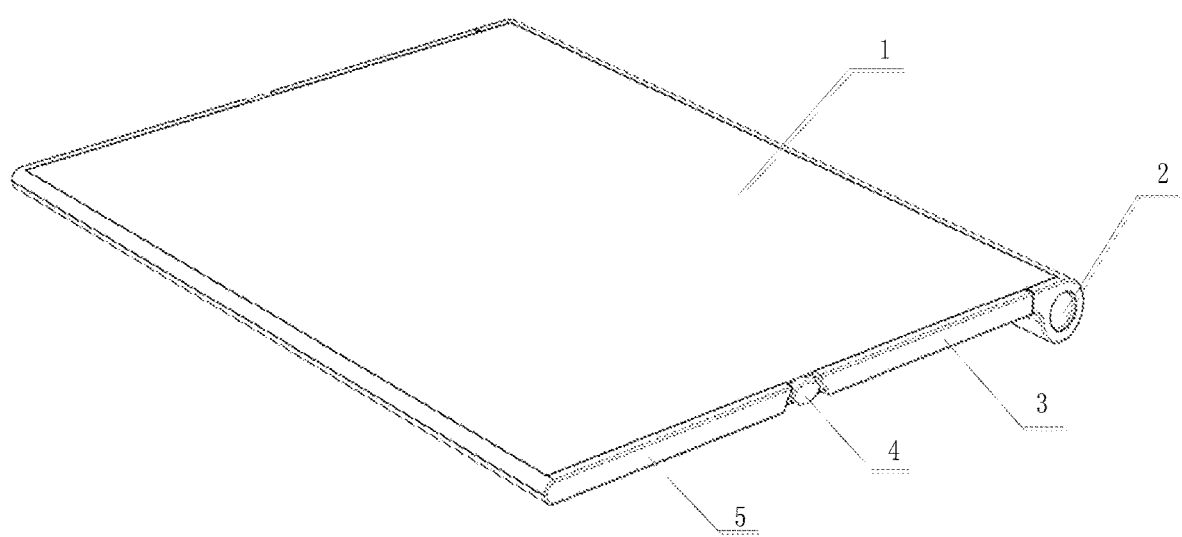
FIG. 7 is a schematic diagram of a fifth structure of the OLED display device according to an embodiment of the present invention.

In an embodiment, as shown in FIG. 7, the OLED display device is folded, wherein the curling section 10 is completely curled into the containing cavity, the first part 5 of the folding mechanism is unfolded, and the first part 5 and the second part 3 are in a same plane.

Wherein, in the OLED display module 1, the outwardly folding section 7, the bending section 8, and the main display section 9 are in a same plane, and the curling section 10 is disposed in the containing cavity.

Figure 8:
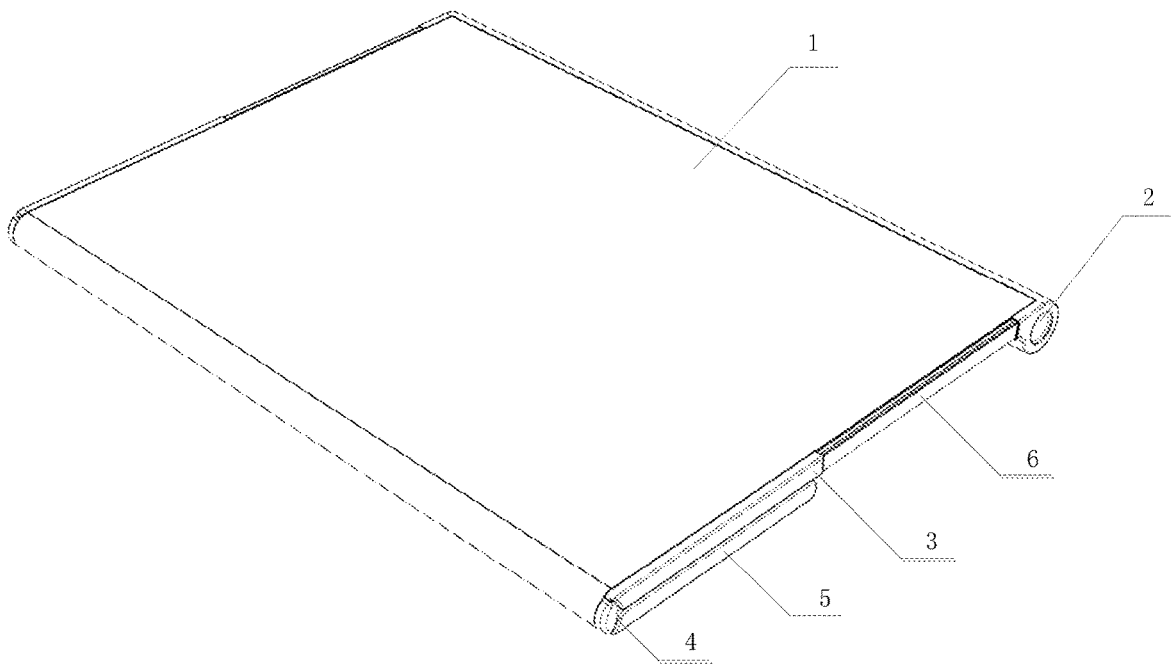
FIG. 8 is a schematic diagram of a sixth structure of the OLED display device according to an embodiment of the present invention.

In an embodiment, as shown in FIG. 8, the OLED display device is folded, wherein the curling section 10 is not curled into the containing cavity, the first part 5 of the folding mechanism is completely folded, and the first part 5 is disposed on the back of the second part 3.

Wherein, at least one of the curling section 10, the outwardly folding section 7, the bending section 8, or the main display section 9 displays an image.

Wherein, the main display section 9 and the outwardly folding section 7 can simultaneously display images.

Wherein, the main display section 9 displays an image, and the outwardly folding section 7 does not display an image.

Wherein, neither the main display section 9 nor the outwardly folding section 7 displays an image, and the curling section 10 displays an image.

Figure 9:
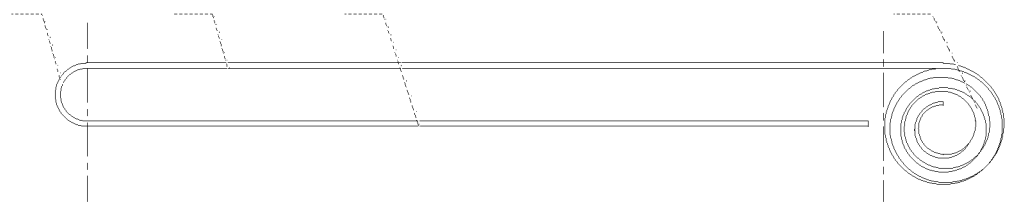
FIG. 9 is a schematic side view of the OLED display module of the OLED display device according to an embodiment of the present invention.

In an embodiment, as shown in FIG. 9, FIG. 10 is a schematic structural diagram of the OLED display module 1. The OLED display module 1 includes the outwardly folding section 7, the bending section 8, the main display section 9, and the curling section 10. The OLED display module 1 is in a completely folded state, wherein the outwardly folding section 7 is positioned on the back of the main display section 9, the curling section 10 is positioned in the containing cavity, and the bending section 8 is in a maximum bending state.

Wherein, at least one of the main display section 9 or the outwardly folding section 7 displays an image.

Wherein, the bending section 8 and the curling section 10 do not display images.

In an embodiment, the curling mechanism includes a third part positioned below the curling section 10.

Figure 11:
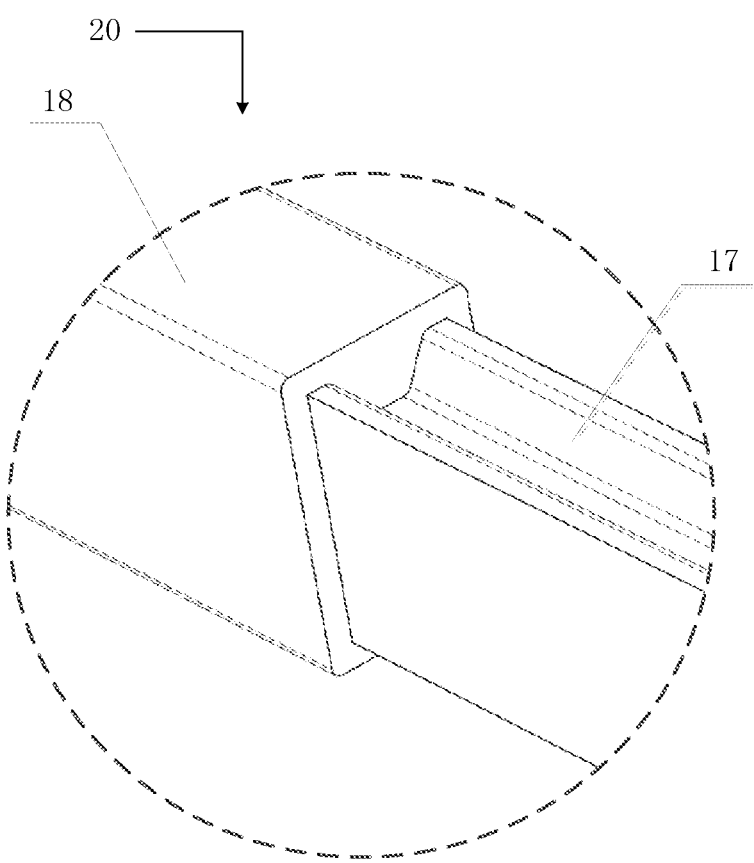
FIG. 11 is an enlarged schematic diagram of a part of the housing of the OLED display device according to an embodiment of the present invention.

In an embodiment, as shown in FIG. 10 and FIG. 11, the second part 3 is disposed with the first fence slide rails 16 and the third part is disposed with a plurality of second fence slide rails 15, and the fence pulleys are disposed on the backs of the main display section 9 and the curling section 10. The fence pulleys are moved on the second fence slide rails 15 to drive the curling section 10 to move into the containing cavity. The fence pulleys are moved on the first fence slide rails 16, thereby driving the main display section 9 to move toward the curling mechanism module 2. When the main display section 9 moves toward the curling mechanism module 2, the sliding groove 18 moves toward the curling mechanism module 2 along the sliding rail 6.

Wherein, when the curling section 10 of the OLED display module is completely curled and moved into the containing cavity, the sliding groove 18 is in contact with the curling mechanism module 2.

Wherein, FIG. 11 is an enlarged schematic diagram of FIG. 10 illustrating a connection 20 of the sliding groove 18 and the sliding rail 6, wherein the sliding groove 18 is in contact with the sliding rail 6, and the sliding rail 6 can be moved along the sliding groove 18.

A housing 11 of the curling mechanism module is in contact with a housing 17 of the sliding rail being drawn.

Wherein, a housing 14 of the first part is in contact with a housing 13 of the second part, and a housing 12 of the third part is in contact with the housing 11 of the curling mechanism module.

The OLED display device according to the embodiment of the present invention includes an OLED display module, wherein the OLED display module includes at least a first sub-display section, a second sub-display section, and a third sub-display section, adjacent sub-display sections are dynamically connected to each other, the first sub-display section, the second sub-display section, and the third sub-display section can be expanded and integrated into a large-area display region, or dynamically accommodated to form at least one display section. By dynamically connecting multiple sub-display sections, a large-sized flexible display screen can be folded, which can alleviate the technical problem that a single folding method of conventional OLED display devices cannot satisfy large-size folding.

The present document uses specific embodiments to explain principles and implementation of the application. Descriptions of above embodiments are only used to help understand technical solutions and core ideas of the application. A person skilled in the art can make various modifications and changes to the above embodiments without departing from the technical idea of the present invention, and such variations and modifications are intended to be within the scope of the invention.

What is claimed is:

1. An organic light-emitting diode (OLED) display device, comprising an OLED display module, wherein the OLED display module comprises at least a first sub-display section, a second sub-display section, and a third sub-display section, adjacent sub-display sections are dynamically connected to each other, the first sub-display section, the second sub-display section, and the third sub-display section can be expanded and integrated into a large-area display region, or dynamically accommodated to form at least one display section;

wherein the OLED display device further comprises a folding mechanism and a curling mechanism comprising a third part below the third sub-display section, the folding mechanism comprises a first part disposed on a back of the first sub-display section, a second part disposed on a back of the second sub-display section, and a folding part in contact with the first part and the second part;

the back of the second sub-display section is provided with a plurality of first fence pulleys, the second part is provided with a plurality of first fence slide rails, a back of the third sub-display section is provided with a plurality of second fence pulleys, the third part is disposed with a plurality of second fence slide rails;

when the first sub-display section, the second sub-display section, and the third sub-display section are expanded or dynamically accommodated, the plurality of first fence pulleys are configured to slide relatively on the plurality of first fence slide rails respectively, the plurality of second fence pulleys are configured to slide relatively on the plurality of second fence slide rails respectively, and each of the plurality of first fence slide rails and a corresponding one of the plurality of second fence slide rails are configured to move relatively with respect to each other.

2. The OLED display device according to claim 1, wherein a bending section is disposed between the first sub-display section and the second sub-display section, when the OLED display module is completely expanded, the first sub-display section, the second sub-display section, and the third sub-display section are disposed in a same plane, and when the OLED display module is completely folded, the bending section is in a bent state, the first sub-display section is bent to the back of the second sub-display section, and the third sub-display section is accommodated into the second sub-display section.

3. The OLED display device according to claim 2, wherein the curling mechanism comprises a curling mechanism module and a sliding rail, and the sliding rail is positioned on the back of the third sub-display section.

4. The OLED display device according to claim 3, wherein the second sub-display section and the third sub-display section are slid relatively through the sliding rail, and the curling mechanism is configured to expand and contract a display screen during a sliding or folding process.

5. The OLED display device according to claim 4, wherein the first sub-display section is an outwardly folding section, the second sub-display section is a main display section, and the third sub-display section is a curling section.

6. The OLED display device according to claim 5, wherein the curling mechanism module comprises a containing cavity, and the containing cavity is configured to receive the curling section in a curled state.

7. The OLED display device according to claim 6, wherein when the OLED display module is completely folded, the outwardly folding section is positioned on a back of the main display section, the curling section is positioned in the containing cavity, and the bending section is in a maximum bending state.

8. The OLED display device according to claim 5, wherein when the OLED display module is completely expanded, the outwardly folding section, the bending section, the main display section, and the curling section are disposed in a same plane, the first part is disposed on a back of the outwardly folding section, the second part is disposed on a back of the main display section, and the folding part is disposed in a back of the bending section.

9. The OLED display device according to claim 5, wherein when the OLED display module is folded, the curling section is completely curled into the containing cavity, the first part of the folding mechanism is unfolded, and the first part and the second part are in a same plane.

10. The OLED display device according to claim 5, wherein when the OLED display module is folded, the curling section is not curled into the containing cavity, the first part of the folding mechanism is completely folded, and the first part is disposed on the back of the second part.

11. The OLED display device according to claim 5, wherein the first part is a housing of the outwardly folding section, and the second part is a housing of the main display section.

12. The OLED display device according to claim 3, wherein the second part is defined with a sliding groove, the sliding groove is defined at an edge of the second part, the sliding groove is in contact with the sliding rail, the sliding groove can be moved along the sliding rail, and when the OLED display module is completely folded, the sliding rail is disposed in the sliding groove.

13. The OLED display device according to claim 12, wherein a longitudinal cross-sectional shape of the sliding groove is rectangular.

14. The OLED display device according to claim 1, wherein the folding part is a folding hinge.

15. The OLED display device according to claim 1, wherein a dynamic connection of the adjacent sub-display sections dynamically connected to each other comprises one or more of bending, curling, or stretching.

16. The OLED display device according to claim 15, wherein the adjacent sub-display sections are dynamically connected to each other by bending, a bending section is disposed between the first sub-display section and the second sub-display section, and a bending section is also disposed between the second sub-display section and the third sub-display section.

17. The OLED display device according to claim 16, wherein when the OLED display module is completely folded, the first sub-display section and the third sub-display section are disposed on the back of the second sub-display section.

* * * * *